(12) United States Patent
Tsironis

(10) Patent No.: US 8,466,758 B1
(45) Date of Patent: Jun. 18, 2013

(54) IMPEDANCE TUNER WITH INTEGRATED BIAS NETWORK

(76) Inventor: Christos Tsironis, Kirkland (CA)

( * ) Notice: Subject to any disclaimer, the term of this patent is extended or adjusted under 35 U.S.C. 154(b) by 19 days.

(21) Appl. No.: 13/180,852

(22) Filed: Jul. 12, 2011

(51) Int. Cl.
*H03H 7/38* (2006.01)

(52) U.S. Cl.
USPC .......................................... 333/263; 333/17.3

(58) Field of Classification Search
USPC ..................................... 333/17.3, 263, 33, 32
See application file for complete search history.

(56) References Cited

U.S. PATENT DOCUMENTS

| | | | | |
|---|---|---|---|---|
| 4,535,307 A | * | 8/1985 | Tsukii | 333/35 |
| 2010/0030504 A1 | * | 2/2010 | Simpson | 702/69 |

OTHER PUBLICATIONS

"Product Note 41: Computer Controlled Microwave Tuner CCMT", Focus Microwaves Inc., Jan. 1996, www.focus-microwaves.com.
"Application Note 54: Spurious Oscillations During Load Pull", Focus Microwaves Inc., Sep. 2002, www.focus-microwaves.com.
"DC Blocks", Pasternack Enterprises, http://www.pasternack.com/category-DC-Blocks-12.html, Apr. 2011.
M. Akmal et. al., "The Effect of Baseband Impedance Termination on the Linearity of GaN HEMTs", Proceedings of the 40th European Conference, Sep. 28-30, 2010, Paris, France.

* cited by examiner

*Primary Examiner* — Stephen Jones

(57) ABSTRACT

Single and multi-probe slide screw impedance tuners incorporate DC bias networks. The bias networks can be inserted at the test port, between DUT and first tuner probe/slug, or at the idle port, between tuner probe/slug and load or source. The bias networks are designed and optimized for different frequency and DC power (current, voltage) ranges and are insertable and exchangeable, depending on the application. The effects are short-circuit protection, higher compactness and shorter supply lines leading to: a) better control of spurious oscillations and IF impedance and b) improved sideband up-mixing behavior of the DUT in modulated-signal nonlinear applications.

15 Claims, 19 Drawing Sheets

Tuner with integrated bias network and DC block capacitor at the test port.

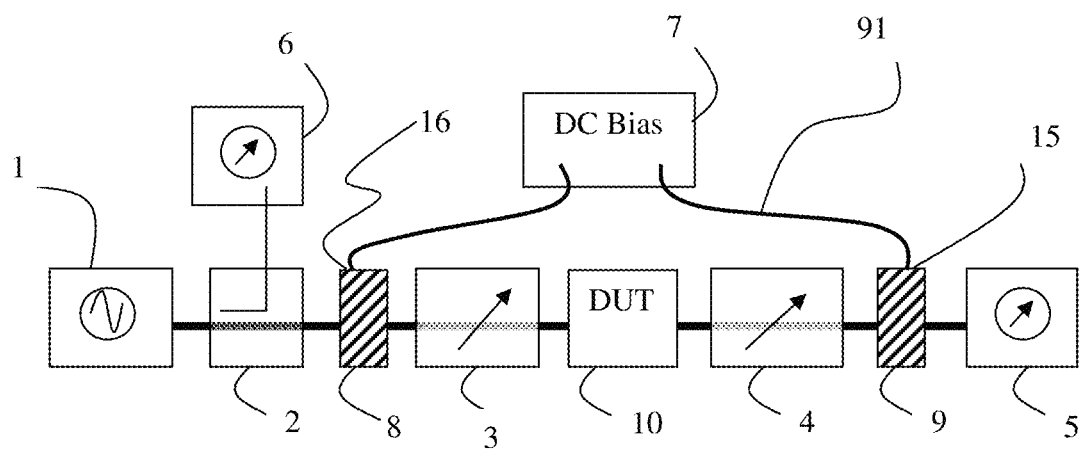
FIGURE 1: Prior art, Load Pull test system using external DC bias networks.

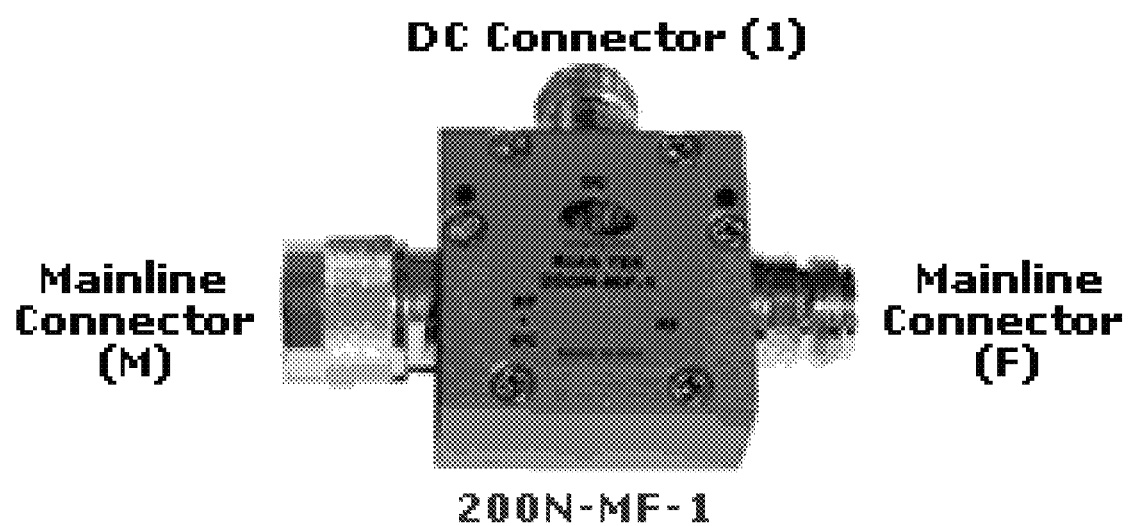
FIGURE 2: Prior art, picture of typical commercial bias network /bias tee.

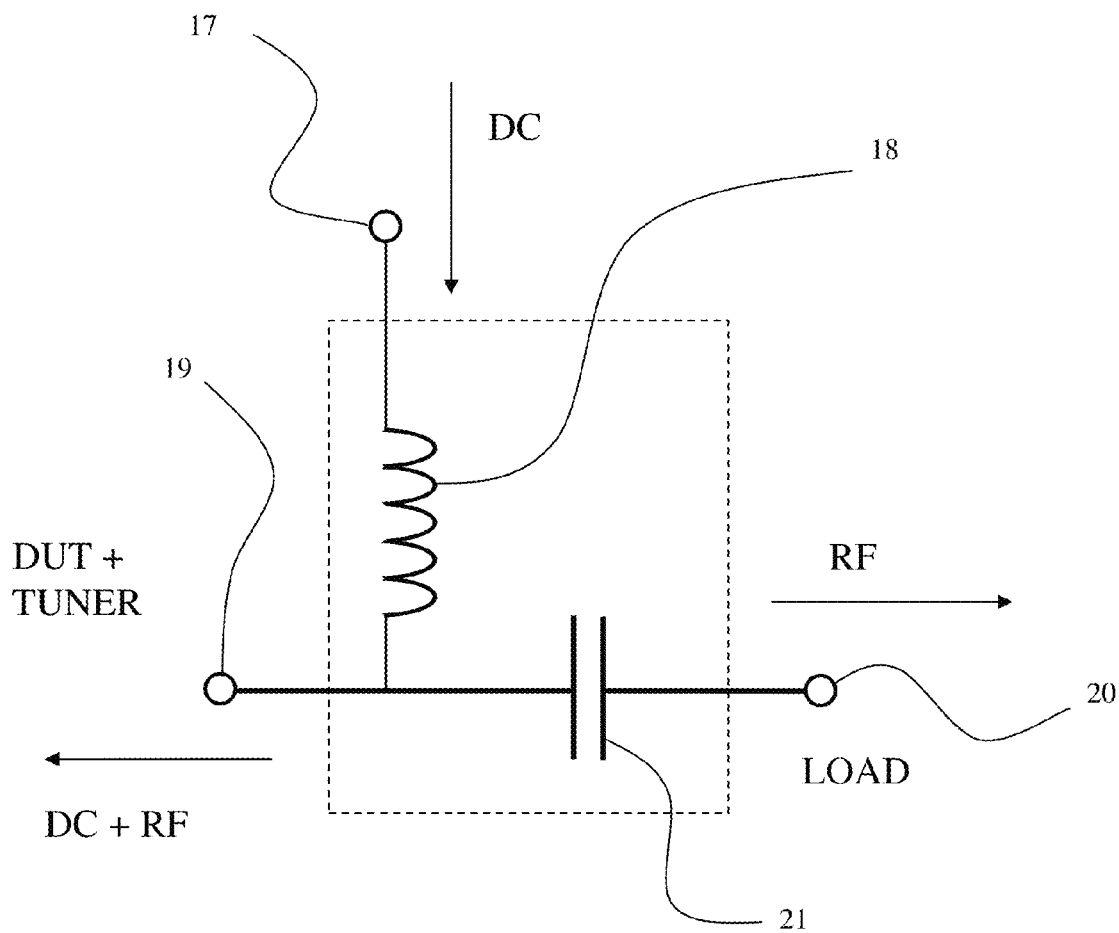
FIGURE 3: Prior art, schematics of output bias network/bias tee.

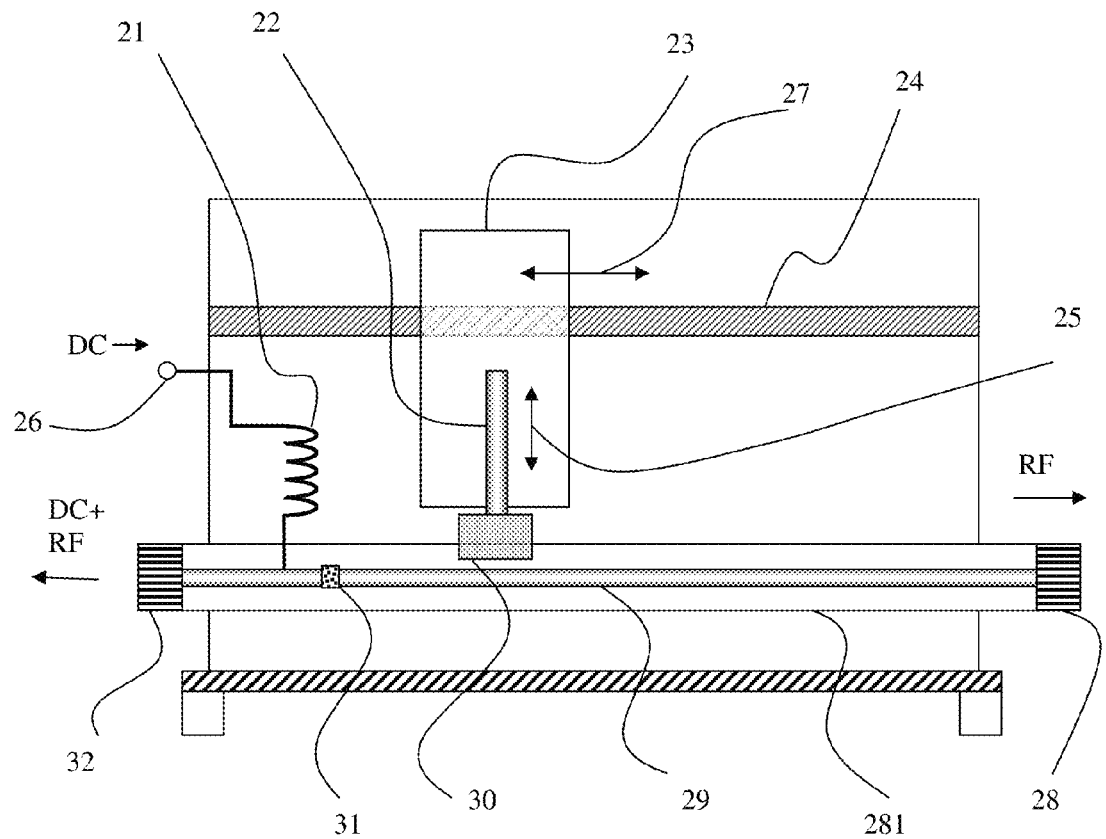
FIGURE 4: Tuner with integrated bias network and DC block capacitor at the test port.

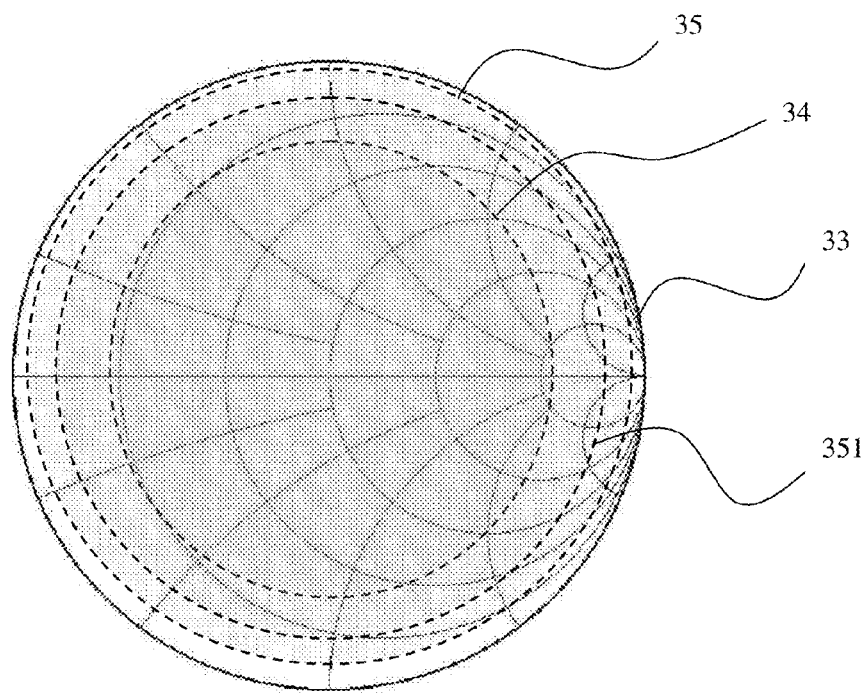
FIGURE 5: Prior art, tuning range of impedance tuners and possible effect of integrated bias networks.

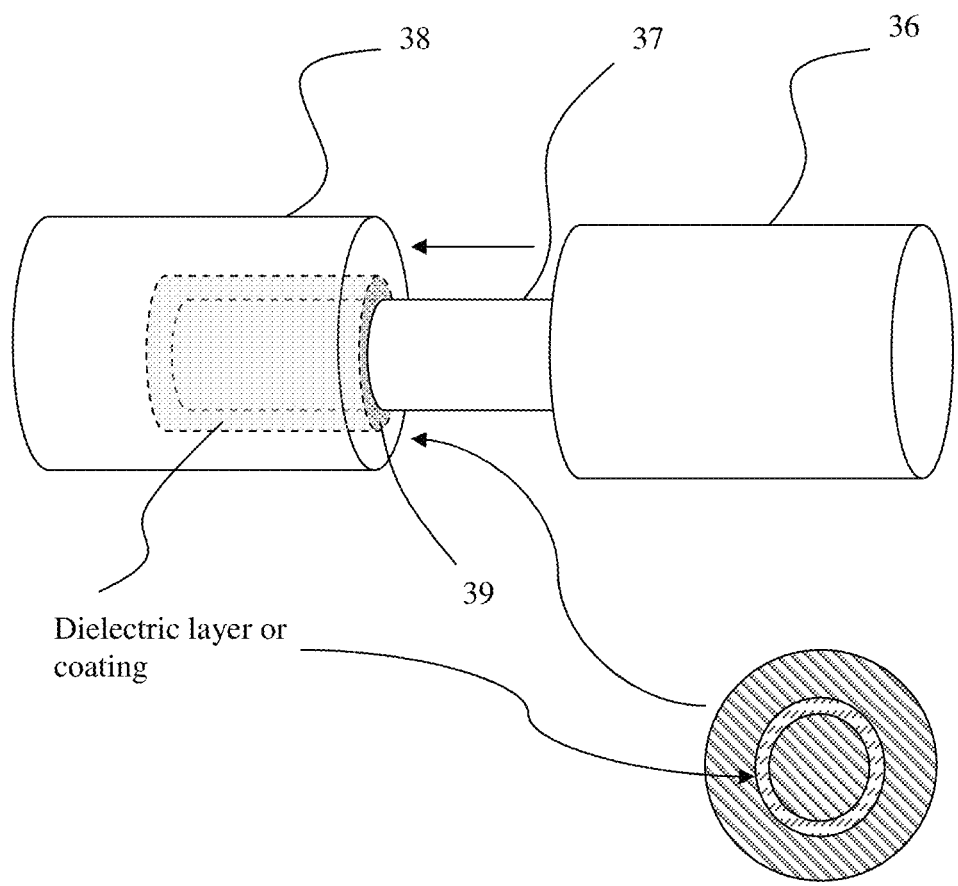
FIGURE 6: Coaxial DC block capacitor inserted in center conductor of tuner.

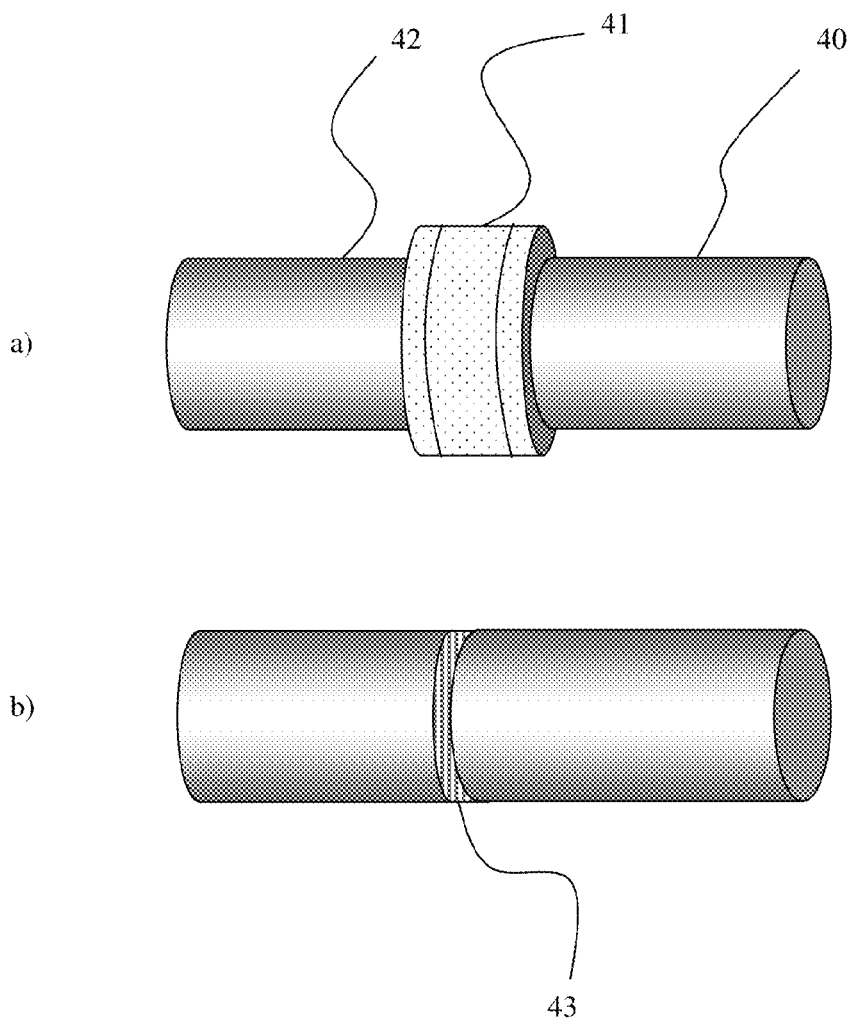
FIGURE 7: Chip Coaxial DC block capacitor inserted in center conductor of tuner

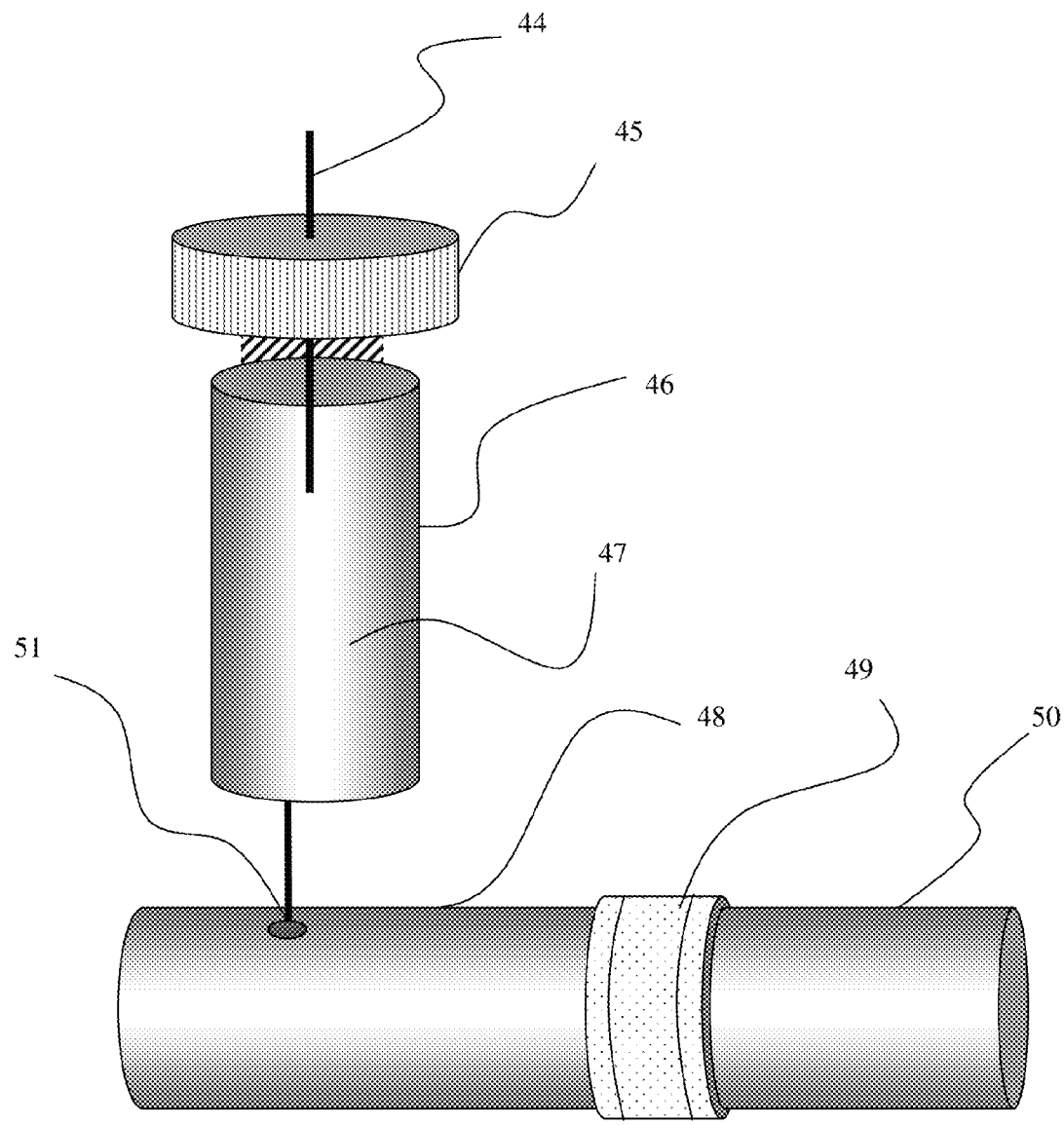
FIGURE 8: Bias network for impedance tuner.

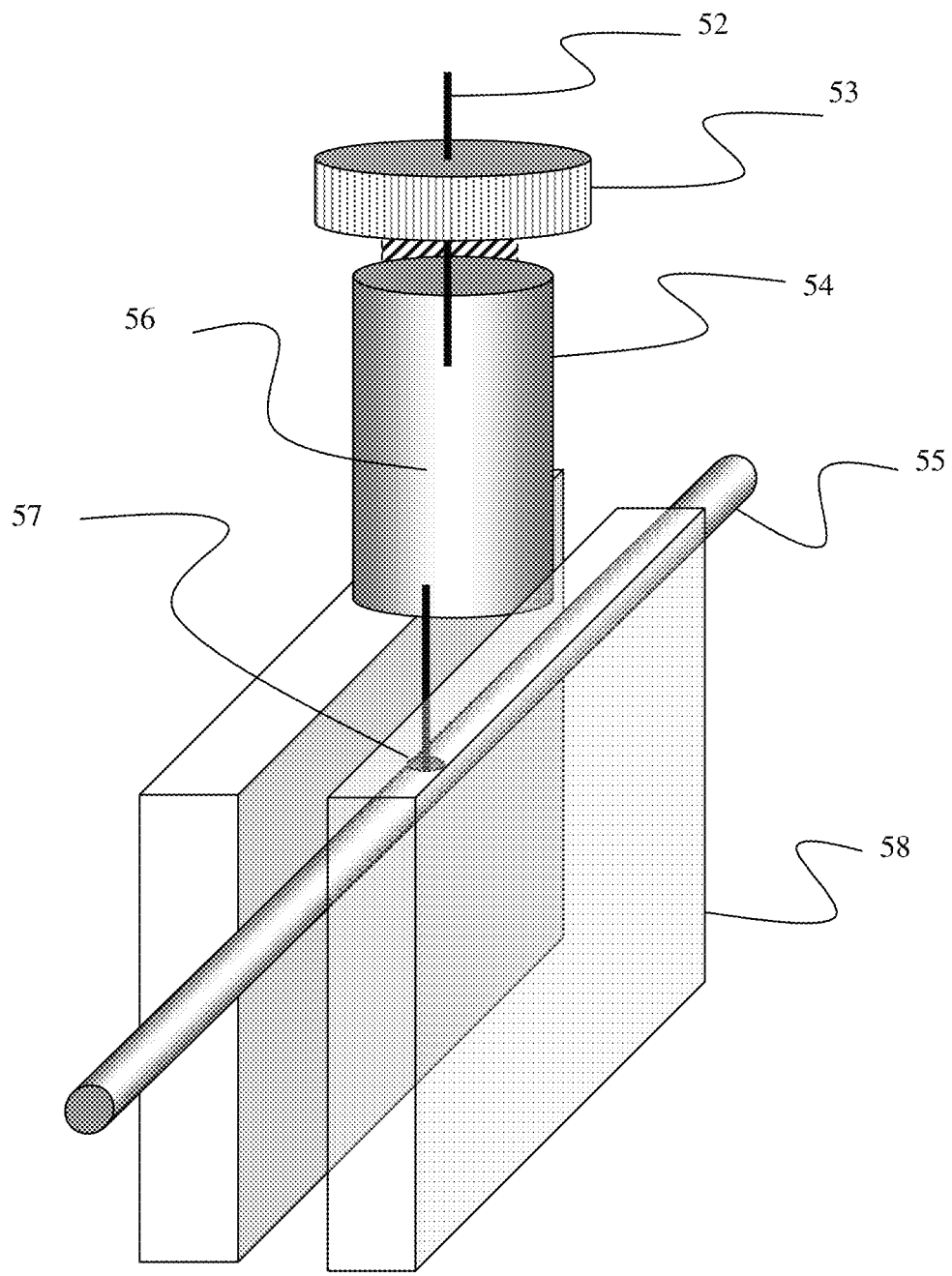
FIGURE 9: Assembly of DC bias network on tuner slabline.

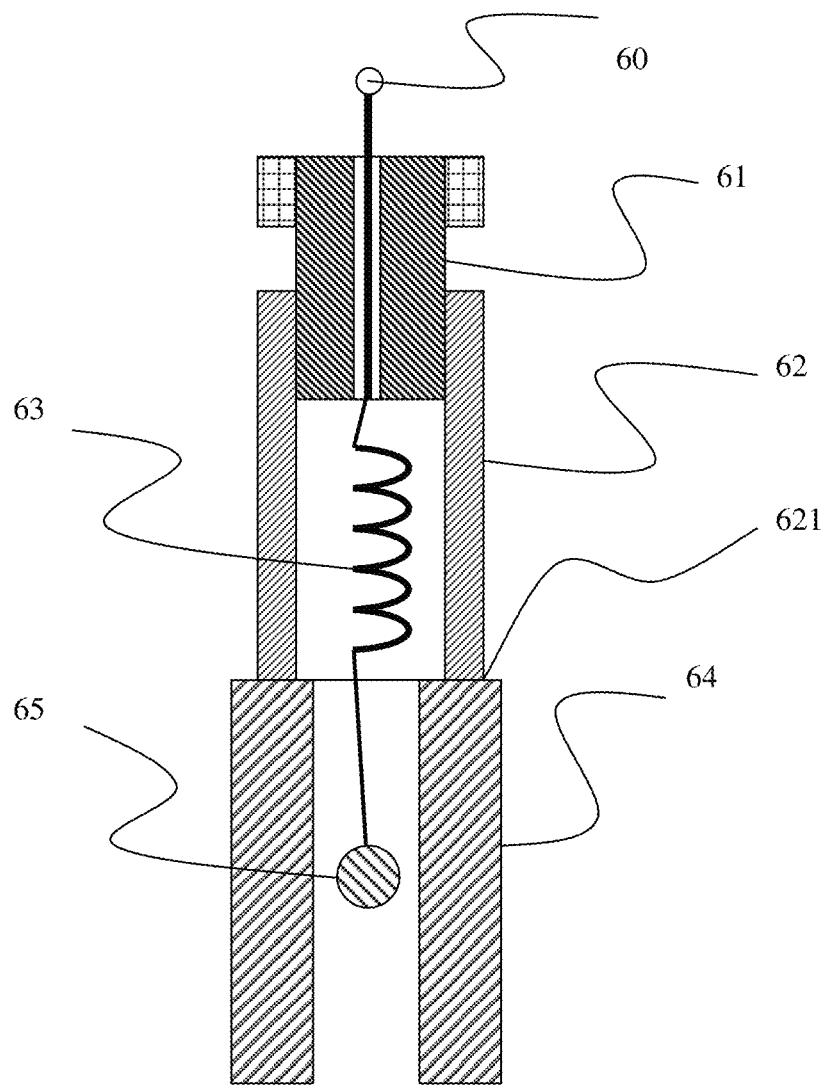
FIGURE 10: Cross section of DC bias network mounted on tuner slabline.

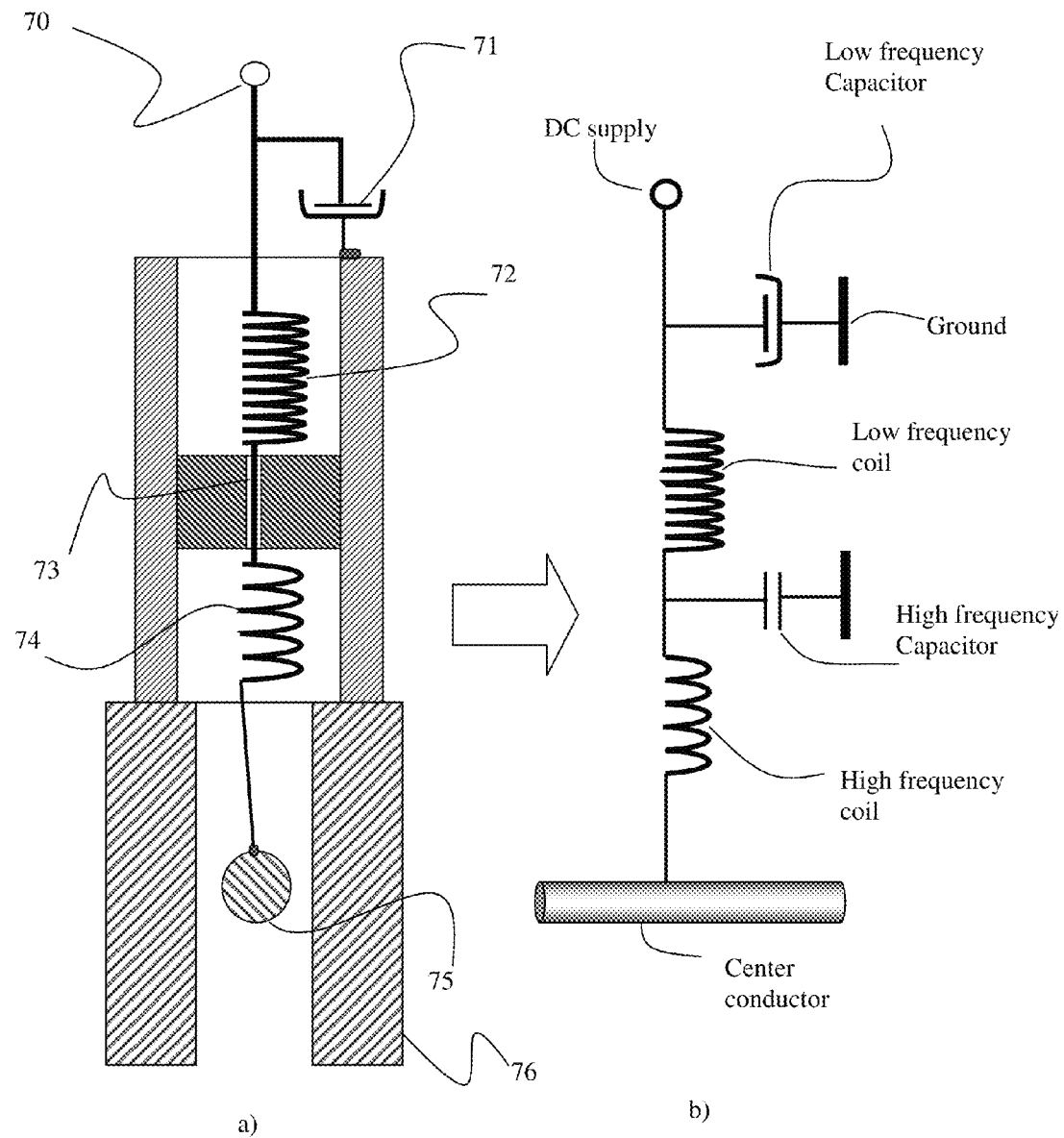
FIGURE 11: (a) Two stage/broadband DC bias network mounted on tuner slabline; (b) Equivalent electrical network.

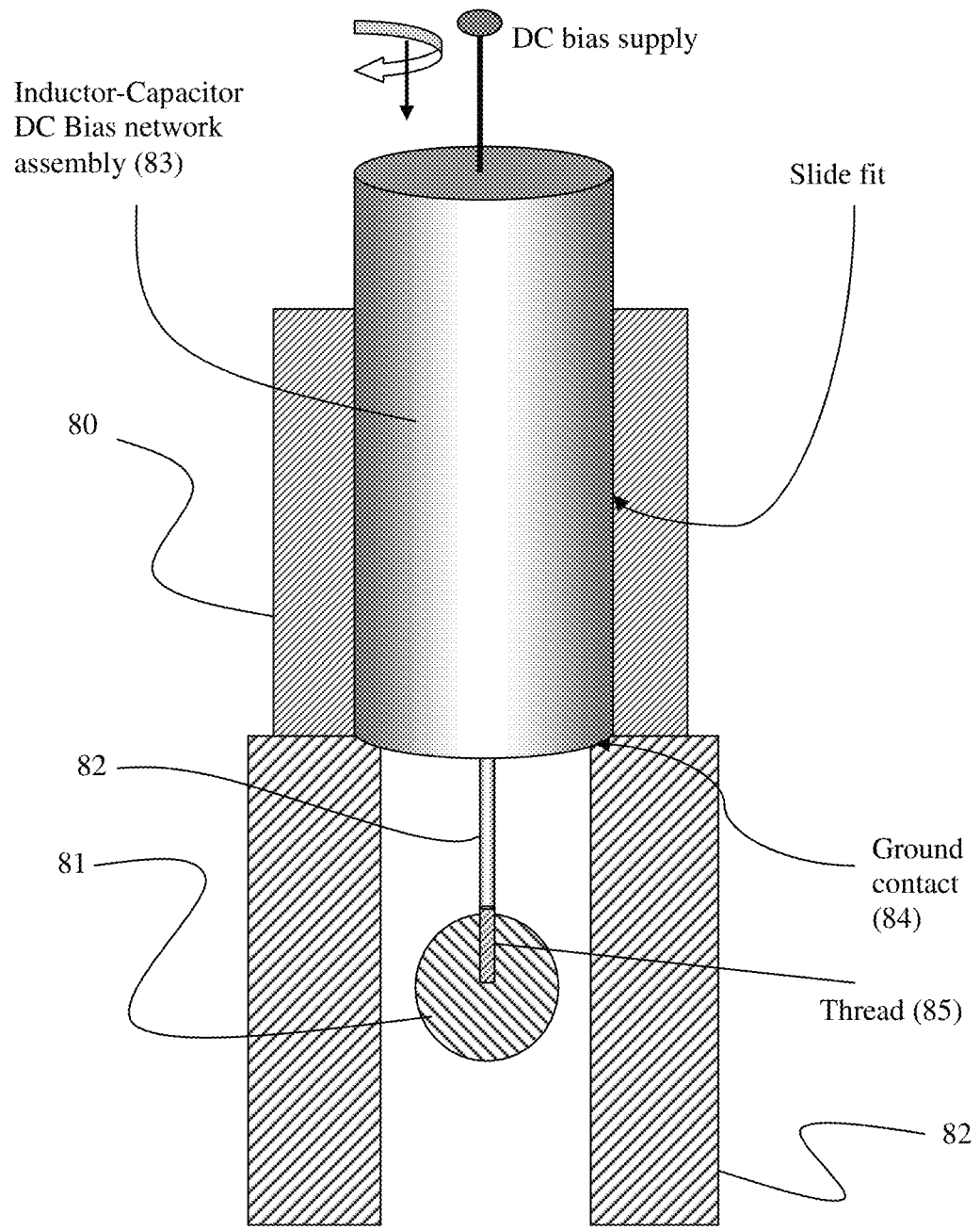
FIGURE 12: Mounting method of DC bias network on tuner slabline.

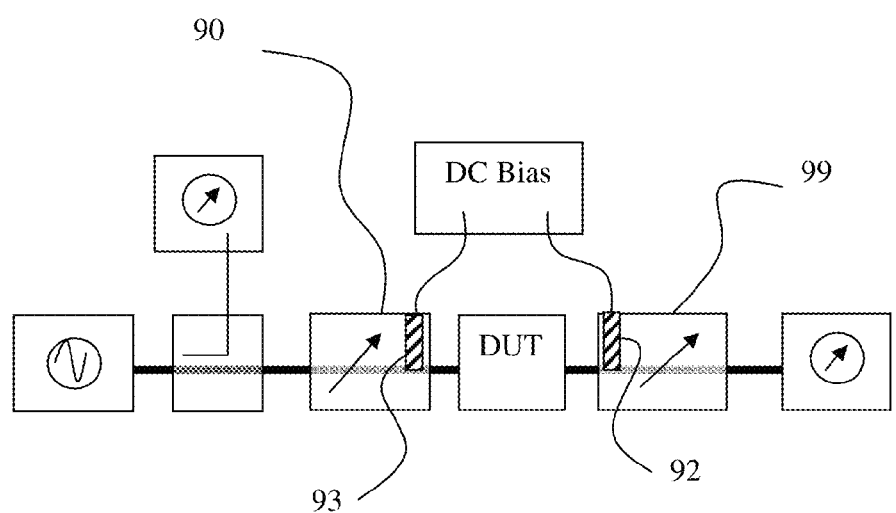
FIGURE 13: Load Pull setup with DC bias networks inside the impedance tuners.

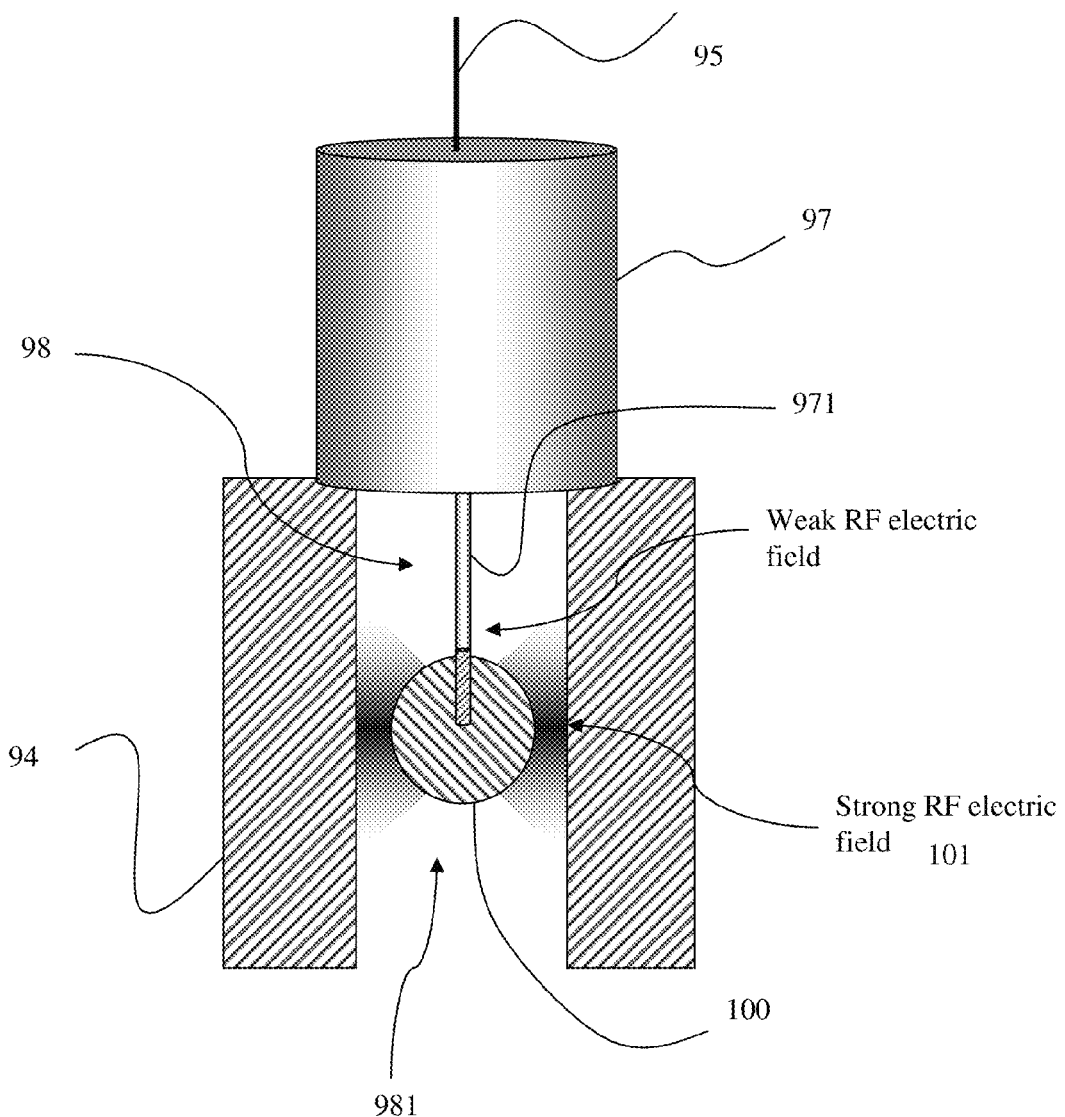
FIGURE 14: DC bias network and electrical field distribution around the center conductor.

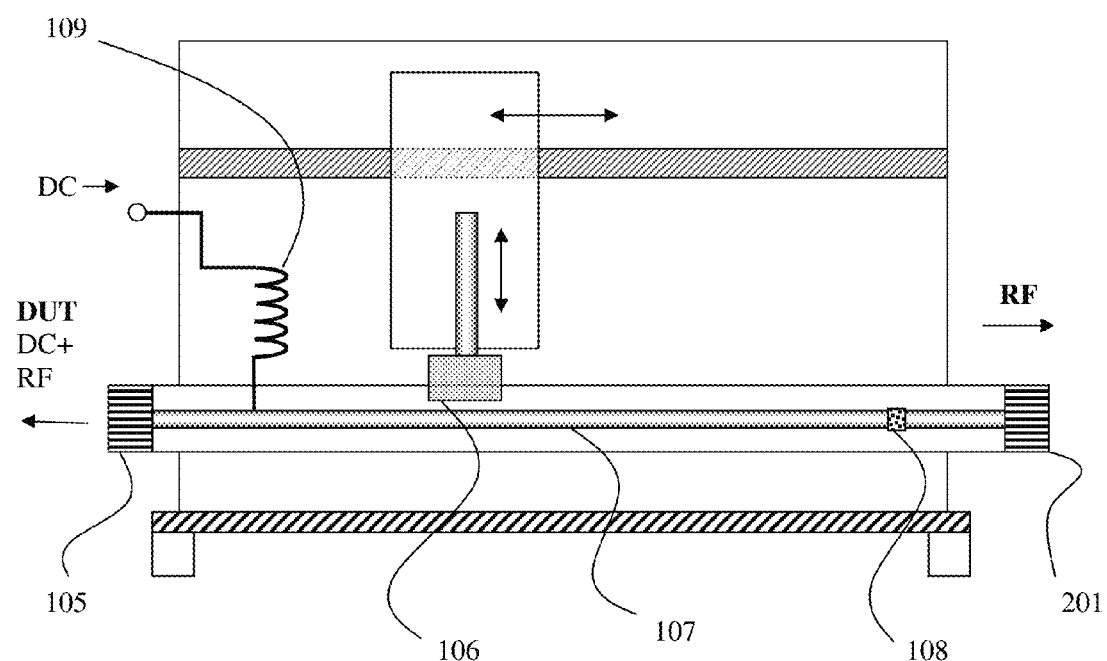
FIGURE 15: Tuner with integrated bias network at test port and DC block capacitor at idle port.

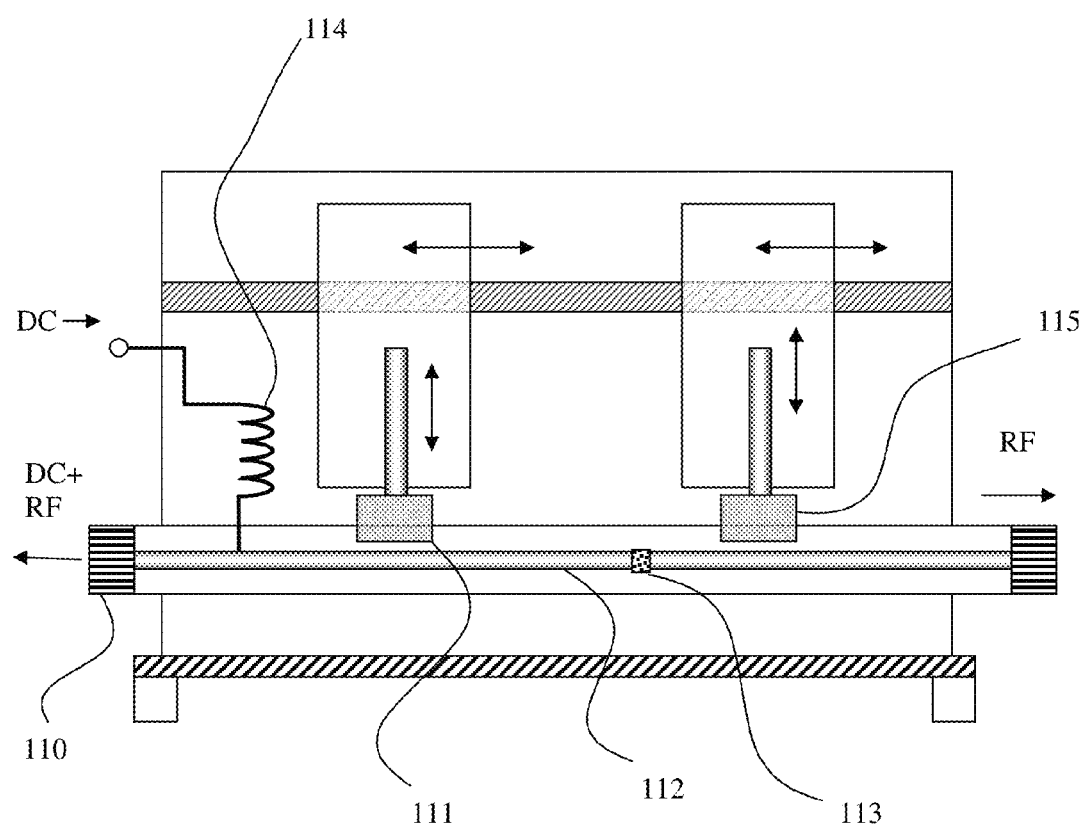
FIGURE 16: Multi-probe tuner with integrated bias network.

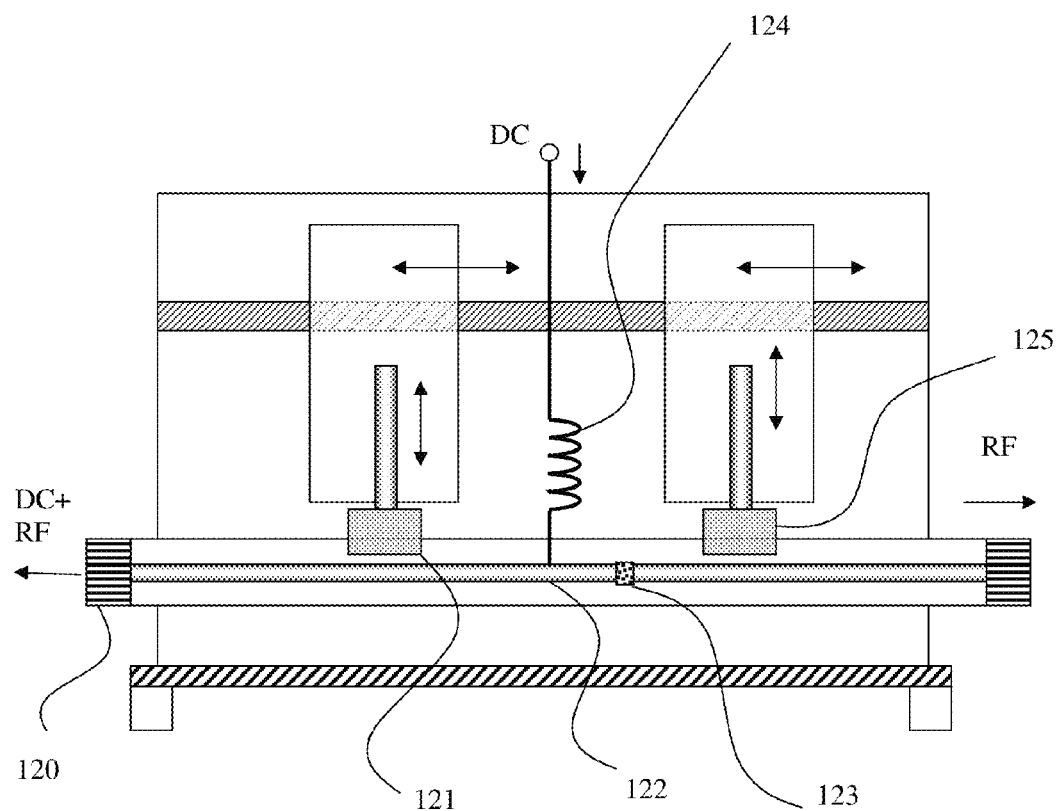
FIGURE 17: Multi-probe tuner with integrated bias network and DC block capacitor between the tuner probes/slugs.

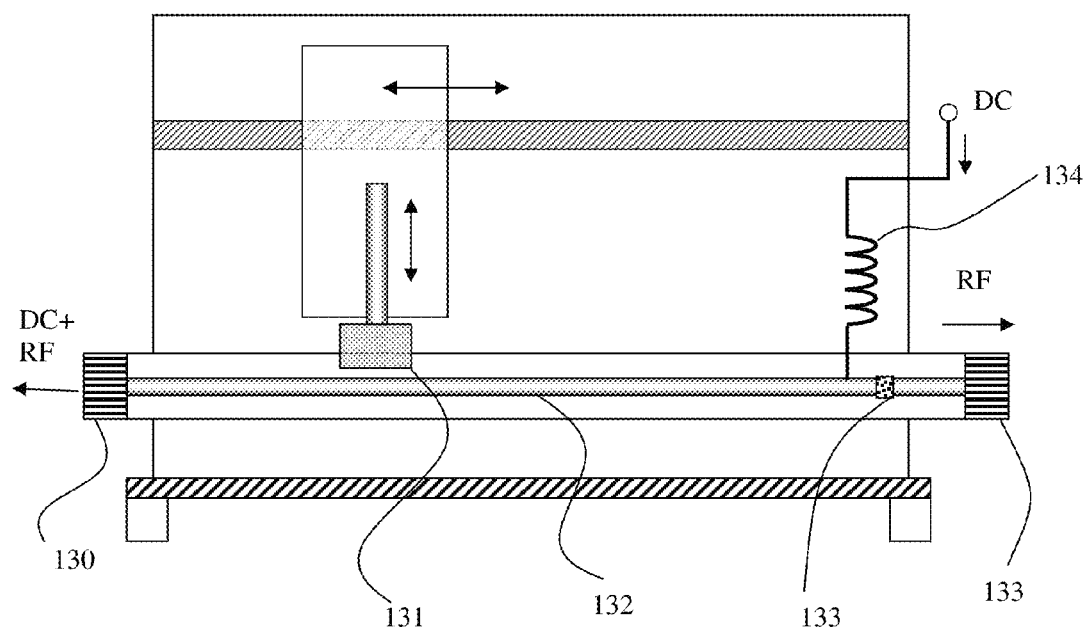
FIGURE 18: Tuner with integrated RF choc and DC block capacitor close to idle port.

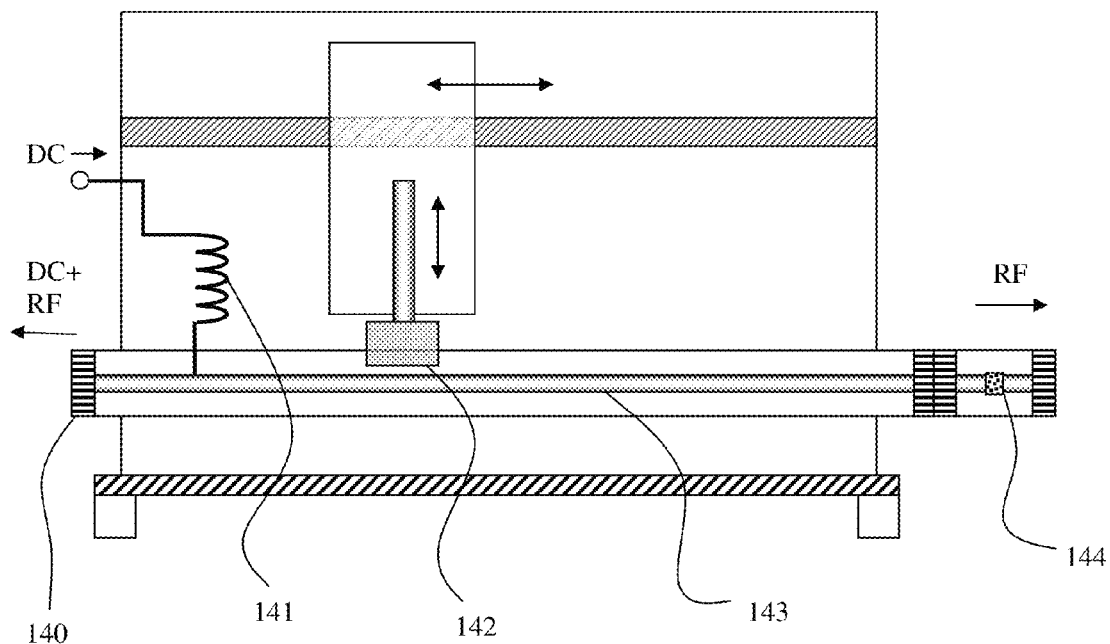
FIGURE 19: Tuner with integrated RF choc, close to the test port and external DC block.

IMPEDANCE TUNER WITH INTEGRATED BIAS NETWORK

PRIORITY CLAIM

Not Applicable

CROSS-REFERENCE TO RELATED ARTICLES

[1] "Product Note 41: Computer Controlled Microwave Tuner CCMT", Focus Microwaves Inc., January 1996, www.focus-microwaves.com
[2] "Application Note 54: Spurious Oscillations During Load Pull", Focus Microwaves Inc., September 2002, www.focus-microwaves.com
[3] "DC Blocks", Pasternack Enterprises, http://www.pasternack.com/category-DC-Blocks-12.html
[4] M. AKMAL et.al., "The Effect of Baseband Impedance Termination on the Linearity of GaN HEMTs", Proceedings of the 40th European Conference, 28-30 Sep. 2010, Paris, France.

STATEMENT REGARDING FEDERALLY SPONSORED RESEARCH OR DEVELOPMENT

Not Applicable

REFERENCE TO SEQUENCE LISTING, A TABLE, OR A COMPUTER PROGRAM LISTING COMPACT DISC APPENDIX

Not Applicable

BACKGROUND OF THE INVENTION

This invention relates to load pull testing of power transistors using automatic microwave impedance tuners in order to synthesize reflection factors (or impedances) at the input and output of said transistors (DUT) and test said DUT under controlled impedance conditions. In addition this invention addresses the matter of supplying DC Bias-to said transistors.

A popular method for testing and characterizing microwave components/transistors for high power operation is "load pull" and "source pull". Load pull or source pull are measurement techniques employing microwave tuners and other microwave test equipment. The microwave tuners in particular are used in order to manipulate the microwave impedance conditions under which the Device Under Test, DUT, or transistor, is tested (FIG. 1). A load pull setup comprises essentially a signal source (1), a directional coupler (2), one or two impedance tuners (3, 4), two power meters (5, 6) and a DC power supply (7) with associated bias networks (8, 9). It also comprises a test fixture to mount the device under test (DUT, 10).

In a typical setup, as shown in FIG. 1, the bias networks are connected in series with the tuner's idle ports (28, FIG. 4). This is the port towards the signal source (1) at the input tuner and the port towards the load (5) at the output tuner. The main reason for placing said bias networks (8, 9) at those places in the setup is the insertion loss of said bias networks. A bias network, also called a "Bias-T"; FIG. 3, comprises a series DC blocking capacitor (21) and a parallel choc inductor (18). It separates the DC bias supply to the DUT from the RF signal. The RF+DC port (19) of the Bias-T is connected to the DUT whereas the RF port (20) is connected either to the signal source or the RF load. The DC port (17) is connected to the DC power supply.

The Bias-T creates insertion loss in the signal path. This is due to the dielectric loss of the series capacitor (21), as well due to signal leakage into the inductor (17). In addition to those two inherent loss sources, the two adapters at ports (19), (20) and FIG. 2, cause RF signal loss. All together, typical, commercially available Bias-T, (FIG. 2) introduces insertion loss between 0.5 and 2 dB. If the Bias-T's were inserted between DUT and tuners (FIG. 1) instead between tuner and source/load, their insertion loss would reduce the tuning range of the tuners (FIG. 5). The tuning range (35) is the area of the Smith chart (33) that can be covered by the tuners at the test port facing the DUT (32); if no bias network is inserted between tuner and DUT, a typical tuning range is shown as (35) in FIG. 5. If a Bias-Tee were inserted between tuner and DUT then the tuning range would be reduced to the area described by the circle (34). In general the main reason for the insertion loss of Bias-T's are the two coaxial mainline connectors needed (FIG. 2). The internal parts of said bias networks (18, 21) generate only part of said insertion loss. One of the benefits of this invention is reducing insertion loss by incorporating said bias networks inside the tuners and avoiding said mainline connectors, which allows inserting Bias-T's between tuners and DUT for better intermodulation performance and spurious oscillations [2], [5].

BRIEF DESCRIPTION OF THE SEVERAL VIEWS OF THE DRAWINGS

The invention and its mode of operation will be more clearly understood from the following detailed description when read with the appended drawings in which:

FIG. 1 depicts prior art, a load pull test set-up using passive electro-mechanical tuners.

FIG. 2 depicts prior art, a typical commercial bias network/bias tee.

FIG. 3 depicts prior art, the schematics of an output bias network/bias tee.

FIG. 4 depicts a tuner configuration with integrated bias network and DC block capacitor placed at the test port.

FIG. 5 depicts prior art, a Smith Chart showing the tuning range of impedance tuners and possible effect of integrated bias networks.

FIG. 6 depicts a coaxial DC capacitor inserted in center conductor of tuner.

FIG. 7 depicts two alternatives of chip coaxial DC block capacitors inserted in center conductor of tuner.

FIG. 8 depicts a bias network for impedance tuner.

FIG. 9 depicts a way to assembly a DC bias network on tuner slabline.

FIG. 10 depicts a cross section of DC bias network mounted on tuner slabline.

FIG. 11 depicts a two stage/broadband DC bias network mounted on tuner slabline (a) and the equivalent electrical network (b).

FIG. 12 depicts a mounting method of DC bias network on tuner slabline.

FIG. 13 depicts a load pull setup with DC bias networks inside the impedance tuners.

FIG. 14 depicts a DC bias network mounted on tuner slabline and electrical field distribution around the center conductor.

FIG. 15 depicts a tuner configuration with integrated bias network placed at test port and DC block capacitor placed at idle port.

FIG. 16 depicts a multi-probe tuner configuration where integrated bias network is placed close to test port and DC block capacitor is placed between tuner probes/slugs.

FIG. 17 depicts a multi-probe tuner configuration where both integrated bias network and DC block capacitor are placed between the tuner probes/slugs.

FIG. 18 depicts a tuner configuration with integrated bias network and DC block capacitor placed close to idle port.

FIG. 19 depicts a tuner configuration with integrated bias network placed close to test port and external DC block.

DETAILED DESCRIPTION OF THE INVENTION

A main reason for inserting Bias-T's between DUT and tuners is shortening the bias lines between DUT (10) and entry points of the DC bias (15 and 16). Said long bias lines, created by the tuner slablines and associated connections, whereas not being critical for DC current supply, have an important effect on intermodulation behavior of the DUT [5] due to mixed down modulation signals, when the DUT is operated in nonlinear mode, or they may cause low frequency spurious oscillations [2].

A typical electromechanical impedance tuner (FIG. 4), [1] comprises a slotted airline (281) and two ports, a test port (32) connected to the DUT and an idle port (28) connected to the signal source (1) or the RF load (5), depending if it serves as a source (3) or load (4) tuner. A metallic probe/slug (30) is moved close to the center conductor (29) of said airline (281) and creates a capacitive load and an associated reflection factor at the test port (32). By moving the slug (30) vertically (25) one can adjust the amplitude of said reflection factor at the test port (32) and by moving said slug (30) horizontally (27) along said airline (281) one can adjust the phase of said reflection factor. This is typically assessed and illustrated on a Smith Chart (FIG. 5). Every point on the Smith chart, inside the "tuning range" can be reached by moving said slug (30) horizontally and vertically. The tuning range of said tuner depends on the construction of the slug (30), the airline (281) and, very importantly, by the quality and insertion loss of the adapters used at the test port (32); insertion loss introduced between the DUT and the slug (30), including the adapter at the test port (32) will reduce the tuning range of the tuner, and thus its capacity to reach the optimum impedance at which the DUT performs best. Every component introducing insertion loss between the DUT and the tuning slug must be optimized and be used only if it improves the system performance in other ways. This is the reason why in traditional load pull setups (FIG. 1) the Bias-T's are connected outside the section "DUT-tuner".

However, there are advantages in using DC capacitors between DUT and tuning slug (30) if the additional loss of adapters of an external Bias-T can be avoided. An advantage of inserting a capacitive DC blocking (31) close to the test port (32) of the tuners and before the (first) probe (30), FIG. 4, is avoiding a DC short at the DUT connector ports if the probe (30) makes galvanic contact to the center conductor (29) of the slabline; driving the probe/slug (30) very close to the center conductor (29) is necessary in order to create high reflection factors by the tuner. The disadvantage of inserting the DC blocking capacitor (31) between the test port (32) of the tuner and the first tuner probe (30) is that any insertion loss created by said block capacitor (31) will reduce the tuning range of the tuner itself at the test port (32). This is shown in FIG. 5 on a Smith chart (33). The tuning range of a state of the art tuner without DC capacitor (31) is shown by the large circle (35). The tuning range of said tuner is illustrated by the reduced circle (351). The tuning range (351) of said tuner, when only a capacitor (31) is inserted in the center conductor (29) is larger than the tuning range (34) of said tuner, when said capacitor (31) is replaced by an external Bias-T's (8, 9 in FIG. 1) and FIG. 2. This is because the external Bias-T (FIG. 2) has additional insertion loss due to its input and output connectors (M, F).

There are various possibilities for making DC block capacitors easily integrated into the center conductor (29) of the tuner airline (281); this is shown in FIGS. 6 and 7. In FIG. 6, said center conductor (36, 38) is sliced vertically and one side (38) is drilled and the other side (36) has its diameter reduced, so that it can enter the hole of the other side with some space; in that space a cylinder of dielectric material (39) can be introduced; this can be a thin layer of Teflon or other dielectric, or the center conductor can be coated with such material. An alternative would be to use Aluminum as material of the center conductor and anodize it. Anodization provides an effective electric insulation and a very thin layer. The thickness of the dielectric layer is important, since, if it is too thick, it will limit the size of the capacitive coupling and thus the series reactance created by the capacitor. If this reactance is too high then it will affect also the performance of the tuner.

FIG. 7 shows alternative techniques of making DC block capacitors on the center conductor of the airline. FIG. 7a uses a chip capacitor (41) [ref chip capacitors] which is soldered or attached with conductive epoxy on both ends (40, 42) of said center conductor. FIG. 7b shows such a miniaturized chip capacitor (43) or a thin layer of ceramic or other dielectric with high dielectric constant [ref dielectrics with high epsilon], which will allow to adapt also to the diameter of said center conductor, in order to minimize electric field deformation.

More complex is the making of the RF choc inductances; said inductances need to cover a wide frequency range and may create resonances with their own fringe capacitances, which exist between the coil inductors. FIGS. 8 to 12 illustrate various configurations of such RF block choc inductors.

FIG. 8 illustrates the principle of an RF choc inductor (46) attachable to the center conductor (48) of the airline, which also includes a DC block capacitor (49). In essence said RF choc comprises a coil inductor (47) with two leads (51 and 44). Lead (51) is attached to the center conductor (48) and lead (44) is connected to the DC power supply (not shown) or battery (7). The coil (47) itself shall be protected inside a grounded cylinder (46) which also holds a feed-through capacitor (45). Said feed-through capacitor ensures a perfect grounding for any RF signal leaking from the center conductor (48) or any spurious signal captured by the bias lines (91) between the lead (44) and the power supply (7). FIG. 11 illustrates the principle of said grounding capacitor, the low frequency capacitor.

FIG. 9 shows a practical implementation of said RF choc inductor block. The coil (56) is encased in a grounded cylinder (54) and the extending leads are attached to the center conductor (57 on 55) and available for DC power (52) after being fed through the feed-though capacitor (53). The cross section and internal layout of said RF choc block is better shown in FIG. 10: The DC connection starts at the center conductor (65) and leads through the coil (63) and the feed-through capacitor (61) to the DC supply plug (60). The whole assembly being best encased in a conductive cylinder (62) which is best grounded (621) on the airline itself (64) for best continuity of the electrical ground and avoidance of leakage and spurious resonances.

FIG. 11 shows a more elaborated scheme of a wideband RF choc block including low and high frequency components; FIG. 11a is the physical layout of the RF choc block and FIG. 11b the electrical equivalent of it. The low frequency components (71, 72) are better suited to block spurious signals from entering into the signal path (75) from the DC plug (70) and bias lines (91) and the high frequency components (73, 74) serve in order to block the RF signal on the center conductor (75) from leaking outside and thus creating undesired signal loss. Component (73) is showing, schematically, a high frequency feed-through capacitor. It is made of a wire conductor fed through a grounded block separated by a thin layer of dielectric, such as Teflon or anodization.

FIG. 12 shows a replaceable RF choc block. This is necessary in order to best operate at various frequency ranges or DC current or voltage levels. High DC currents require thicker wiring in the coils and higher voltage requires high breakdown capacitors. Said components must obey practical considerations and must be selected to meet the required operating conditions. An efficient method for exchangeable attachment of the lower lead (82) of the RF choc to the center conductor (81) is to include a thread (85) on said center conductor, in which the threaded lead can be screwed by turning the body (83) of said RF choc inside a slide-fit, grounded cylinder (80) until said RF choc housing (83) establishes good ground contact with the airline (84).

In summary, an improved load pull test setup, including bias networks (92, 93) integrated inside the source and load tuners (90, 99) is shown in FIG. 13. This setup incorporates a number of advantages compared with the setup of FIG. 1, in particular concerning the length of DC bias lead lines and associated low frequency mixing effects of modulated signals [5].

In FIG. 14 it is explained why attaching the RF choc block at the top of the center conductor will the smallest possible effect on the RF electric field distribution inside the tuner. As can be seen the electric field inside such a parallel plate airline/slabline (94) is concentrated in the area (101) between center conductor (100) and slabline walls (94). Above (98) and below (981) of said center conductor (100) the RF electric field is very weak. Therefore making a galvanic contact with the lower lead (971) of the RF choc (97) will create the minimum possible RF current leak into said lead.

FIGS. 15 to 19 show various possible configurations of DC bias blocks to be integrated in single and multiple probe/slug impedance tuners.

FIG. 15 shows a simple alternative of the basic configuration of FIG. 4: In order to keep the DC lead wire short the RF choc (109) is attached close to the test port (105) whereas the DC block capacitor (108) is inserted in the center conductor (107) close to the idle port (201) in order to avoid introducing the capacitor's insertion loss between DUT and probe (106) and thus reduce the tuner's tuning range (351).

In the case of a two probe tuner (FIG. 16) said DC block can be split in two: The RF choc block (114) is inserted close to the test port (110) and before the first probe/slug (111). The DC block capacitor (113) is inserted in the center conductor (112) between the first/pre-matching probe (111) and the second/tuning probe (115). This minimizes the length of the DC supply line (114) but does not protect from a short circuit possibly created by the pre-matching probe (111). On the other hand the insertion loss of the DC block capacitor (113) does not reduce the tuning range of the first probe (111). Said DC block capacitor does, though protect from a short circuit of the second probe (115), but does also reduce its tuning range. This is possibly a good measure, because, while the pre-matching probe (111) is mainly fixed, the tuning probe (115) is mainly movable and more at a risk of a short circuit.

In FIG. 17 a configuration is proposed, which has advantages concerning tuning range (considering that even the RF choc (124) does reduce the tuning range) but does not improve short circuit protection. In this case both the RF choc (124) and the DC capacitor (123) blocks are assembled between the pre-matching probe (121) and the tuning probe (125). In FIG. 18 the whole assembly of RF choc (134) and DC capacitor (133) blocks are mounted close to the idle port (135) of said tuner. This is the least advantageous configuration from shortening the bias lines of the DC supply and short circuit protection points of view and is the closest configuration to an external Bias-T. However it has the advantage of avoiding an extra component and a set of adapters, associated with the external Bias-T. A final combination of DC and RF blocks is shown in FIG. 19; here the RF choc is mounted closest to the test port (140) but the DC block capacitor is an external DC block [3] which can be selected independently and optimized for the power and DC voltage requirements of the test procedure.

The principle of incorporating DC block capacitors and/or RF choc inductors in electromechanical impedance slide screw tuners has been outlined in this invention in various possible configurations, allowing for shorter DC power lines and short circuit protection. Alternative configurations using the same concept are imaginable but they shall not impede on the validity or limit the claims to obvious combinations and variations of this basic concept.

What I claim as my invention is:

1. A method for exchanging the DC bias network integrated in a programmable electro-mechanical impedance slide screw tuner;

said DC network comprising a DC branch and an RF branch;

and said tuner comprising a test (input) port and an idle (output) port and a slotted airline/slabline between said ports and one or more mobile carriages traveling along the axis of said slabline, each said carriage carrying one or more RF probes insertable vertically into the slot of said slabline;

said DC network being inserted between the test port and the idle port of the tuner and mounted on the center conductor of said slabline;

and whereby said DC branch has two ends, one end being connected to the center conductor of the slabline and the other end to an external power supply;

and whereby said RF branch has two ends and is inserted in series with the center conductor of the slabline;

and whereby said DC branch is inserted between the tuner test port and the RF branch;

and whereby said DC network is exchangeable by disconnecting the DC branch from the center conductor.

2. A tuner as in claim 1 whereby each said metallic RF probe/slug is attached to a precise vertical axis, which allows said slug to be inserted into said slabline and create controllable capacitive coupling with the center conductor of said slabline; both said tuner carriages and slugs being controlled remotely by associated gear and electronic control and firmware.

3. A tuner as in claim 1 whereby each said DC bias network separates the RF signal from the DC power and is mounted on the center conductor of said slabline;

and whereby said network can be exchanged by interrupting the connection of the DC branch with the center conductor.

4. DC bias networks for a tuner as in claim 1, comprising an inductive assembly (DC branch) and a DC blocking capacitor assembly (RF branch);

whereby said DC branch comprises at least one inductor/coil and at least one grounded shunt capacitor; said inductor and capacitor being dimensioned to filter out RF signal of a specific frequency range and allowing DC current to flow though;

and whereby said RF branch comprises at least one capacitor dimensioned to block DC current but allow RF signal of a specific frequency range to flow through.

5. A mechanism for dis-connecting and replacing the DC branch of said DC bias network in claim 4 to the center conductor of the slabline of said tuner ensuring low disturbance of the electric field inside the slabline, by attaching the lead of the inductors/coils to the top of the center conductor.

6. A DC bias network as in claim 4 in which said DC branch is made of a conductive cylinder in which the said coil is inserted axially without electrically contacting the cylinder;
   whereby the first end of said coil is attached to the center conductor of the slabline;
   and whereby the second end of said coil is attached to a grounded feed-through capacitor;
   and whereby said second end of said coil is connected to an external DC power supply;
   and whereby said conductive cylinder makes perfect galvanic contact with the grounded lateral walls of said slabline.

7. A DC bias network as in claim 4 in which said DC branch is made of a conductive cylinder in which two coils, coil 1 and 2, are inserted axially in series without making electrical contact with the cylinder walls, each coil having two ends, 1 and 2;
   and two grounded feed-through capacitors 1 and 2;
   whereby end 1 of coil 1 is attached to the center conductor of the slabline;
   and whereby end 2 of coil 1 is connected to feed-through capacitor 1;
   and whereby end 2 of coil 1 is also connected to end 1 of coil 2;
   and whereby end 2 of coil 2 is connected to feed-through capacitor 2;
   and whereby said second end of said coil 2 is also connected to an external DC power supply;
   and whereby said conductive cylinder makes perfect galvanic contact with the grounded lateral walls of said slabline.

8. A DC branch as in claim 7, whereby
   coil 1 is selected for having a high resistance and resonance at high frequencies in the range of the operating frequency;
   and coil 2 is selected for having high resistance and resonance at low frequencies, below the range of the operating frequency;
   and feed-through capacitor 1 is selected for having low resistance at high frequencies in the range of the operating frequency;
   and feed-through capacitor 2 is selected for having low resistance at low frequencies, below the range of the operating frequency.

9. DC bias networks for a tuner as in claim 1 comprising a DC blocking capacitor in line with the center conductor of the slabline, in order to stop DC current from flowing through the idle tuner port towards the load or source impedances connected to said tuner.

10. A DC bias network as in claim 9 in which said DC blocking capacitor is placed between the tuner test port and the tuner carriage closest to the test port.

11. A DC bias network as in claim 9 in which said DC blocking capacitor is placed between the first tuner carriage, closest to the test port, and the second tuner carriage of a multi-carriage tuner.

12. A DC bias network as in claim 9 in which said DC blocking capacitor is placed between the idle tuner port and the last tuner carriage, closest to the idle tuner port.

13. A DC bias arrangement as in claim 9 in which said DC blocking capacitor assembly (DC block) is connected externally to the tuner slabline at said tuner's idle port.

14. An RF branch as in claim 9 in which said DC blocking capacitor is inserted by cutting the center conductor in two horizontal sections and attaching a chip capacitor in series between the two sections of said conductor.

15. A DC branch as in claim 9 in which said DC blocking capacitor is made by cutting the center conductor in two horizontal sections and drilling a centered hole in one section and machining a cylindrical protrusion in the opposite section of slightly smaller diameter as the corresponding hole in the other section;
   and insulating the surface of said protrusion and/or inner surface of said hole by depositing a thin dielectric coat, or anodizing, and inserting said protrusion into said hole of the center conductor.

* * * * *